United States Patent
Jung et al.

(10) Patent No.: US 9,502,182 B2
(45) Date of Patent: Nov. 22, 2016

(54) SOLAR CELL AND METHOD OF MANUFACTURING THE SAME

(71) Applicant: Research & Business Foundation Sungkyunkwan University, Suwon-si (KR)

(72) Inventors: Hyun Suk Jung, Seoul (KR); Gill Sang Han, Anyang-si (KR); Hyun Suk Chung, Seoul (KR)

(73) Assignee: RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 230 days.

(21) Appl. No.: 14/158,002

(22) Filed: Jan. 17, 2014

(65) Prior Publication Data
US 2014/0202527 A1   Jul. 24, 2014

(30) Foreign Application Priority Data

Jan. 23, 2013 (KR) .................. 10-2013-0007507

(51) Int. Cl.
| | |
|---|---|
| *H01L 31/044* | (2014.01) |
| *H01G 9/00* | (2006.01) |
| *H01L 51/42* | (2006.01) |
| *H01L 51/44* | (2006.01) |
| *H01L 51/00* | (2006.01) |

(52) U.S. Cl.
CPC ........ *H01G 9/0029* (2013.01); *H01L 51/4226* (2013.01); *H01L 51/442* (2013.01); *H01L 51/0086* (2013.01); *H01L 2251/308* (2013.01); *Y02E 10/542* (2013.01); *Y02E 10/549* (2013.01); *Y02P 70/521* (2015.11)

(58) Field of Classification Search
CPC ....... H01L 31/00–31/078; Y02E 10/50–10/60
USPC .................................. 136/243–265
See application file for complete search history.

(56) References Cited

U.S. PATENT DOCUMENTS

| | | | | |
|---|---|---|---|---|
| 2010/0200051 A1* | 8/2010 | Triani | .................. | H01G 9/2031 136/255 |
| 2012/0255607 A1* | 10/2012 | Roy-Mayhew | ...... | H01G 9/2031 136/256 |

FOREIGN PATENT DOCUMENTS

| | | |
|---|---|---|
| KR | 10-2011-0087226 A | 8/2011 |
| KR | 10-2012-0008231 A | 1/2012 |

OTHER PUBLICATIONS

E. Joani, R. Savu, M. S. Goes, P. Bueno, J. N. Freitas, A. F. Nogueira, E. Longo, J. A. Varela, Dye-sensitized Solar Cell Architecture Based on Indium—Tin Oxide Nanowires Coated with Titanium Dioxide, Scripta Materialia, 57, 2007, 277-280.*

* cited by examiner

*Primary Examiner* — Bach Dinh

(57) ABSTRACT

A solar cell is disclosed. The solar cell includes a transparent conductive layer formed on a substrate, microstructures protruding vertically aslant from a surface of the transparent conductive layer, an electron transport layer configured to cover the microstructures and formed of an electron transport metal oxide, a light absorber adhered to inner pores and a surface of the electron transport layer, a hole transport layer configured to cover the surface of the electron transport layer and formed of a hole transport material, and an electrode formed on the hole transport layer. In the solar cell, the thickness of a light absorption layer can be maximized to obtain a high current density and high photoelectric conversion efficiency.

14 Claims, 6 Drawing Sheets

SOLAR CELL AND METHOD OF MANUFACTURING THE SAME

CROSS-REFERENCE TO RELATED APPLICATION

This application claims priority to and the benefit of Korean Patent Application No. 10-2013-0007507, filed on Jan. 23, 2013, the disclosure of which is incorporated herein by reference in its entirety.

BACKGROUND

1. Field of the Invention

The present invention relates to a solar cell and a method of manufacturing the same, and more particularly, to a dye-sensitized solar cell (DSSC) and a method of manufacturing the same.

2. Discussion of Related Art

Nowadays, developing clean alternative energy sources is urgent due to high oil prices and environmental pollution. Among various alternative energy sources, the use of solar energy has been recognized as the most economical method, and there has been a growing interest in a solar cell configured to directly convert light energy into electric energy.

Presently, solar cells may be classified into silicon solar cells, compound solar cells, copper indium gallium selenide (CIGS) solar cells, dye-sensitized solar cells (DSSCs), and organic solar cells depending on a structure or how to operate. Among these, the first DSSC was successfully developed by Michael Gratzel, a professor at the Swiss Federal Institute of Technology in Lausanne. A DSSC may embody a transparent or semitransparent solar cell using a low-price process, generate various colors according to an organic dye, and obtain high energy conversion efficiency.

However, a thick-film liquid-electrolyte-based DSSC may have low light transmittance and be unstable due to the use of a liquid electrolyte. The low light transmittance and instability have become obstructions to commercialization of liquid-electrolyte-based DSSCs.

To solve the problems of the liquid-electrolyte-based DSSCs, Michael Gratzel, the professor at the Swiss Federal Institute of Technology in Lausanne, reported an efficiency of about 0.74% using an organic-material-based solid electrolyte instead of a liquid electrolyte in 1998 in Nature [Nature Vol 395, P 583]. Since then, a vast amount of research into DSSCs using solid electrolytes has progressed.

However, a solid-electrolyte-based solar cell has much lower energy conversion efficiency than conventional liquid-electrolyte-based solar cells and other solar cells. At present, when 2,2',7,7'-tetrakis(N,N-di-p-methoxyphenylamine)-9-9'-spirobifluorene [Spiro-OMeTAD] serving as a hole transfer organic material is used as a solid electrolyte and a light absorption layer has a thickness of about 2 µm, a solar cell exhibits an energy conversion efficiency of about 5%. When the light absorption layer has a small thickness of about 2 µm, light cannot be efficiently utilized, and electrons of an inorganic semiconductor used for the light absorption layer may rapidly combine with holes of an organic semiconductor.

To overcome this drawback, a large amount of research has been conducted on increasing hole mobility of an organic material used as a hole conductor, but the efficiency is still merely about 2% to about 4%. Although there have been recent attempts at improving the thickness of a light absorption layer using $TiO_2$ nanotubes [J. Mater. Chem., 2009, Vol 19, P 5325], the thickness of the light absorption layer is still limited to about 2 µm.

SUMMARY OF THE INVENTION

The present invention is directed to a solar cell in which a thickness of a light absorption layer may be maximized to increase current density and photoelectric conversion efficiency.

The present invention is also directed to a method of manufacturing the solar cell.

According to an aspect of the present invention, there is provided a solar cell including: a substrate, a transparent conductive layer formed on the substrate, microstructures protruding vertically aslant from a surface of the transparent conductive layer, an electron transport layer configured to fill at least part of space between the microstructures and cover the microstructures, the electron transport layer formed of an electron transport metal oxide, a light absorber adhered to inner pores and a surface of the electron transport layer, a hole transport layer configured to fill inner pores of the electron transport layer and cover the surface of the electron transport layer to which the light absorber is attached, the hole transport layer formed of a hole transport material, and an electrode formed on the hole transport layer.

In an exemplary embodiment, the microstructures may include a nano-linear structure. In this case, the nano-linear structure may include at least one selected from the group consisting of nanorods, nanowires, and nanoneedles.

The transparent conductive layer and the microstructures may be formed of at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, $(La_{0.5}Sr_{0.5})CoO_3$ (LSCO), $La_{0.7}Sr_{0.3}MnO_3$ (LSMO), and $SrRuO_3$ (SRO). The doped indium oxide may include at least one selected from the group consisting of tin (Sn)-doped indium oxide (indium tin oxide; ITO), indium gallium zinc oxide (IGZO), indium gallium oxide (IGO), and indium zinc oxide (IZO). The doped tin oxide may include fluorine (F)-doped tin oxide (FTO, $F:SnO_2$). The doped zinc oxide may include at least one selected from the group consisting of Ga-doped zinc oxide (GZO) and aluminum (Al)-doped zinc oxide (AZO). The doped strontium titanate may include $Nb:SrTiO_2$, and the doped titanium oxide may include $Nb:TiO_2$.

In an exemplary embodiment, the electron transport layer may be formed of at least one material selected from the group consisting of $TiO_2$, $ZnO$, $SnO_2$, $WO_3$, $Fe_2O_3$, $Zn_2SnO_3$, $BaTiO_3$, and $BaSnO_3$. The electron transport layer may include an electron transport thin film configured to coat the microstructures and the surface of the transparent conductive layer, and an electron transport nanoparticle layer formed on the electron transport thin film and having higher porosity than the electron transport thin film. The electron transport thin film may prevent the microstructures from being in direct contact with the hole transport layer. The electron transport layer may have a thickness of about 1 nm to about 200 nm. The electron transport nanoparticle layer may include electron transport metal oxide nanoparticles coated over the electron transport thin film.

In an exemplary embodiment, the light absorber may include an organic dye or inorganic dye adhered to inner pores and a surface of the electron transport nanoparticle layer. The organic dye may include a ruthenium (Ru)-based organic dye, and the inorganic dye may include at least one selected from the group consisting of CdS, CdSe, CdTe, PbS, PbSe, PbTe, InP, InGaP, InAs, InCuS$_2$, InCuSe$_2$, CuFeS$_2$, InN, In$_2$S$_3$, InSb, PbS, PbSe, Bi$_2$S$_3$, Bi$_2$Se$_3$, Sb$_2$S$_3$, Sb$_2$Se$_3$, SnTe, SnS$_x$, NiS, CoS, FeS, In$_2$S$_3$, ZnSe, ZnTe, MoS, MoSe, Cu$_2$S, Ge, Si, CsPbI$_3$, CsPbBr$_3$, CsSnI$_3$, CsSnBr$_3$, CH$_3$NH$_3$PbBr$_3$, CH$_3$NH$_3$SnBr$_3$, CH$_3$NH$_3$PbI$_3$, CH$_3$NH$_3$SnI$_3$, and alloys thereof.

In an exemplary embodiment, the hole transport layer may be formed to fill inner pores of the electron transport nanoparticle layer and cover a surface of the electron transport nanoparticle layer. The hole transport layer may be formed of an organic photovoltaic material. For example, the organic photovoltaic material may include at least one selected from the group consisting of Spiro-OMeTAD, P3HT, P3AT, P3OT, and PEDOT:PSS.

According to another aspect of the present invention, there is provided a method of manufacturing a solar cell includes forming a transparent conductive layer on a substrate, forming microstructures on the transparent conductive layer using a conductive metal oxide, forming an electron transfer layer using an electron transfer metal oxide to coat surfaces of the microstructures and the transparent conductive layer, adsorbing a light absorber in inner pores of the electron transfer layer and on a surface of the electron transfer layer, forming a hole transfer layer using a hole transfer material on the electron transfer layer to which the light absorber is adsorbed, and forming an electrode on the hole transfer layer.

In an exemplary embodiment, the microstructures may be formed by growing nano-linear structures of the conductive metal oxide on the surface of the transparent conductive layer. The nano-linear structures may be formed of at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, (La$_{0.5}$Sr$_{0.5}$)CoO$_3$ (LSCO), La$_{0.7}$Sr$_{0.3}$MnO$_3$ (LSMO), and SrRuO$_3$ (SRO). The nano-linear structures may include at least one selected from the group consisting of nanorods, nanowires, and nanoneedles. The microstructures may be formed using at least one selected from the group consisting of a vapor liquid solid (VLS) process, a chemical vapor deposition (CVD) process, a metal organic CVD (MOCVD) process, a pulsed laser deposition (PLD) process, a sol-gel process, a hydrothermal synthesis process, a wet chemical process, and a paste thick process or a vapor deposition process. The formation of the microstructures may include forming a seed layer using a noble metal on the transparent conductive layer, fusing the seed layer to form solution droplets of the noble metal on the transparent conductive layer, and providing a vaporized precursor of the conductive metal oxide to the solution droplets of the noble metal to grow nano-linear structures of the conductive metal oxide. In this case, the seed layer may be formed to a thickness of about 10 nm to about 50 nm using a sputtering process.

In an exemplary embodiment, the formation of the electron transport layer may include forming an electron transport thin film using the electron transfer metal oxide to coat the surfaces of the microstructures and the transparent conductive layer, and forming a porous electron transfer nanoparticle layer on the electron transfer thin film, the porous electron transfer nanoparticle layer including nanoparticles of the electron transfer metal oxide. The electron transfer thin film may be formed using at least one method selected from the group consisting of a chemical vapor deposition (CVD) process, an atomic layer deposition (ALD) process, a layer-by-layer (LBL) deposition process, and a spin coating process. In an example, the electron transfer thin film may be formed to a thickness of about 1 nm to about 200 nm. The formation of the electron transfer nanoparticle layer may include coating precursor nanoparticles of the electron transfer metal oxide on the electron transfer thin film, and annealing the precursor nanoparticles. In this case, the precursor nanoparticles may be coated using at least one selected from the group consisting of a screen printing process, a spin coating process, or a doctor blade process.

In an exemplary embodiment, the adsorption of the light absorber may include dipping the electron transfer layer in a solution in which a ruthenium-based organic dye is dissolved.

In an exemplary embodiment, the hole transfer layer may be formed by spin-coating a hole transfer containing the hole transfer material on the electron transfer layer.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
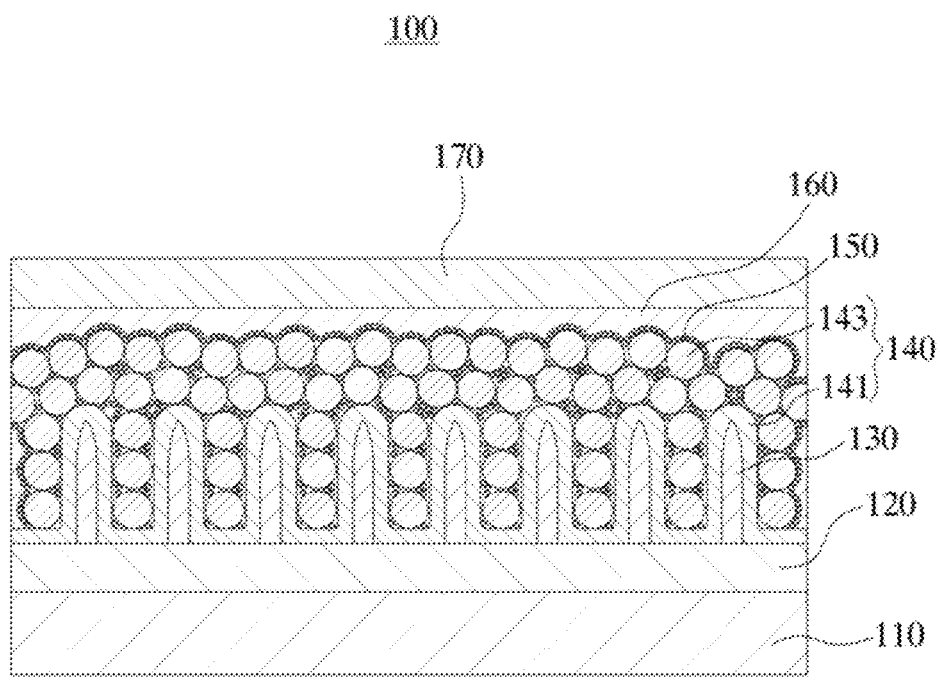
FIG. 1 is a diagram of a dye-sensitized solar cell (DSSC) according to an exemplary embodiment of the present invention.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Accordingly, while the invention can be modified in various ways and take on various alternative forms, specific embodiments thereof are shown in the drawings and described in detail below as examples. There is no intent to limit the invention to the particular forms disclosed. On the contrary, the invention is to cover all modifications, equivalents, and alternatives falling within the spirit and scope of the appended claims. Elements of the exemplary embodiments are consistently denoted by the same reference numerals throughout the drawings and detailed description. In the drawings, the size and relative sizes of structures may be exaggerated for clarity.

The terminology used herein is for the purpose of describing particular embodiments only and is not intended to be limiting of the invention. As used herein, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

<Dye-Sensitized Solar Cell (DSSC)>

FIG. 1 is a diagram of a DSSC 100 according to an exemplary embodiment of the present invention.

Referring to FIG. 1, the DSSC 100 according to the exemplary embodiment of the present invention may include a transparent substrate 110, a transparent conductive layer 120, microstructures 130, an electron transport layer 140, a light absorber 150, a hole transport layer 160, and an electrode layer 170.

The transparent substrate 110 may be a typical semiconductor substrate or crystal substrate. The transparent substrate 110 may be an inexpensive and easily handleable substrate that withstands a process temperature for forming the microstructures 130. For example, the transparent substrate 110 may be a silicon (Si) substrate, a silicon oxide ($SiO_2$) substrate, an aluminum oxide ($Al_2O_3$) substrate, or a strontium titanium oxide ($SrTiO_3$; STO) substrate.

The transparent conductive layer 120 may be disposed on the transparent substrate 110. The transparent conductive layer 120 may be formed of a conductive metal oxide. For example, the transparent conductive layer 120 may be formed of at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, ($La_{0.5}Sr_{0.5}$)$CoO_3$ (LSCO), $La_{0.7}Sr_{0.3}MnO_3$ (LSMO), and $SrRuO_3$ (SRO). The doped indium oxide may be at least one selected from the group consisting of tin (Sn)-doped indium oxide (indium tin oxide; ITO), indium gallium zinc oxide (IGZO), indium gallium oxide (IGO), and indium zinc oxide (IZO), and the doped tin oxide may be fluorine (F)-doped tin oxide (FTO, F:$SnO_2$). The doped zinc oxide may be at least one selected from the group consisting of Ga-doped zinc oxide (GZO) and aluminum (Al)-doped zinc oxide (AZO). The doped strontium titanate may be Nb:$SrTiO_2$, and the doped titanium oxide may be Nb:$TiO_2$.

The microstructures 130 may include nanoscale structures or microscale structures formed vertically or aslant from a surface of the transparent conductive layer 120. In an example, the microstructures 130 may include nano-linear structures. In this case, the nano-linear structures may include nanorods, nanowires, and nanoneedles. The microstructures 130 may be formed of the same material as the transparent conductive layer 120. For example, the microstructures 130 may be formed of at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, ($La_{0.5}Sr_{0.5}$)$CoO_3$ (LSCO), $La_{0.7}Sr_{0.3}MnO_3$ (LSMO), and $SrRuO_3$ (SRO). The doped indium oxide may be at least one selected from the group consisting of ITO, IGZO, IGO, and IZO, and the doped tin oxide may be FTO (F:$SnO_2$). The doped zinc oxide may be at least one selected from the group consisting of GZO and AZO. The doped strontium titanate may be Nb:$SrTiO_2$, and the doped titanium oxide may be Nb:$TiO_2$. In an exemplary embodiment, the transparent conductive layer 120 and the microstructures 130 may be formed of ITO because ITO has excellent physical properties, for example, high electrical conductivity and high optical transparency.

The electron transport layer 140 may be formed to fill space between the microstructures 130 and cover the microstructures 130. The electron transport layer 140 may be formed of a metal oxide by which electrons may be transported. For example, the electron transport layer 140 may be formed of $TiO_2$, ZnO, $SnO_2$, $WO_3$, $Fe_2O_3$, $Zn_2SnO_3$, $BaTiO_3$, or $BaSnO_3$. The electron transport layer 140 may be formed of $TiO_2$ to increase electron mobility and prevent annihilation of electrons.

In an exemplary embodiment, the electron transport layer 140 may include an electron transport thin film having relatively low porosity and a porous electron transport nanoparticle layer 143 having relatively high porosity.

The electron transport thin film 141 may be formed to cover surfaces of the microstructures 130 and a surface of the transparent conductive layer 120. The electron transport thin film 141 having relatively low porosity (i.e., a high density) may be formed to cover the surfaces of the microstructures 130 and the transparent conductive layer 120 so that electrons generated by the light absorber 150 can be easily collected by the conductive microstructures 130, and the microstructures 130 and the transparent conductive layer 120 can be prevented from being in direct contact with the hole transport layer 160. When the electron transport thin film 141 has a thickness of about 1 nm or less, electrons and holes generated during the driving of the solar cell may recombine very rapidly at interfaces between the microstructures 130. Also, when the electron transport thin film 141 has a thickness of about 200 nm or more, generated electrons may not be easily collected by the microstructures 130 and the electrons may rapidly recombine with holes. In an exemplary embodiment, the electron transport thin film 141 may be formed to a thickness of about 10 nm to about 50 nm to facilitate separation of the electrons from the holes.

The electron transport nanoparticle layer 143 may include electron transport metal oxide nanoparticles coated on the electron transport thin film 141. The electron transport metal oxide nanoparticles may be disposed in spaces between the microstructures 130 coated with the electron transport thin film 141 and on the microstructures 130 coated with the electron transport thin film 141. When the electron transport metal oxide nanoparticles are disposed as described above, the thickness of a light absorption layer may be increased to increase an electron diffusion length in the light absorption layer. As a result, high electron collection efficiency may be obtained. The electron transport nanoparticle layer 143 may be a porous layer to increase a contact area between the electron transport nanoparticle layer 143 and a light absorber 150 to be combined with the electron transport nanoparticle layer 143 later.

The light absorber 150 may be combined with a surface of the electron transport layer 140 and pores of the electron transport layer 140. For example, the light absorber 150 may be combined with surfaces of the electron transport metal oxide nanoparticles. In the present invention, as described above, since the electron transport metal oxide nanoparticles are also disposed in spaces between the microstructures 130, the thickness of the light absorption layer may markedly increase. The light absorber 150 may be in contact with the surfaces of the electron transport metal oxide nanoparticles forming the electron transport layer 140 and form interfacial surfaces. The light absorber 150 may be an organic dye or an inorganic dye. The organic dye may be a ruthenium (Ru)-based organic dye, such as N719 or N3. Also, the inorganic dye may include at least one selected from the group consisting of CdS, CdSe, CdTe, PbS, PbSe, PbTe, InP, InGaP, InAs, InCuS$_2$, InCuSe$_2$, CuFeS$_2$, InN, In$_2$S$_3$, InSb, PbS, PbSe, Bi$_2$S$_3$, Bi$_2$Se$_3$, Sb$_2$S$_3$, Sb$_2$Se$_3$, SnTe, SnS$_x$, NiS, CoS, FeS, In$_2$S$_3$, ZnSe, ZnTe, MoS, MoSe, Cu$_2$S, Ge, Si, CsPbI$_3$, CsPbBr$_3$, CsSnI$_3$, CsSnBr$_3$, CH$_3$NH$_3$PbBr$_3$, CH$_3$NH$_3$SnBr$_3$, CH$_3$NH$_3$PbI$_3$, CH$_3$NH$_3$SnI$_3$, and alloys thereof.

The hole transport layer 160 may be formed on the electron transport layer 140 combined with the light absorber 150. The hole transport layer 160 may be formed to fill the pores of the electron transport layer 140 and cover the surface of the electron transport layer 140. The hole transport layer 160 may be formed of an organic photovoltaic material. The organic photovoltaic material may be a conjugated polymer material in which an energy difference between a highest occupied molecular orbital (HOMO) level and a lowest unoccupied molecular orbital (LUMO) level is within about 3.5 eV. For example, the organic photovoltaic material may be at least one selected from the group consisting of Spiro-OMeTAD, P3HT, P3AT, P3OT, and PEDOT:PSS.

The electrode layer 170 may be formed on the hole transport layer 160. The electrode layer 170 may be formed of a conductive metal or a compound thereof. For example, the electrode layer 170 may be formed of at least one material selected from the group consisting of gold (Au), silver (Ag), platinum (Pt), palladium (Pd), copper (Cu), aluminum (Al), vanadium (V), molybdenum (Mo), and compounds thereof.

<Method of Manufacturing DSSC>

FIG. 1 is a diagram of a DSSC according to an exemplary embodiment of the present invention, and FIGS. 2A through 2G are diagrams illustrating a method of manufacturing a solar cell according to an exemplary embodiment of the present invention.

Referring to FIGS. 1 and 2A through 2E, the method of manufacturing the solar cell according to the exemplary embodiment of the present invention may include forming a transparent conductive layer 120 on a substrate 110, forming microstructures 130 on the transparent conductive layer 120, forming an electron transport layer 140 between the microstructures 130 and on the electron transport layer 140, forming a hole transport layer 160 on the electron transport layer 140 and inner pores of the electron transport layer 140, and forming an electrode layer 170 on the hole transport layer 160.

Figure 2A:
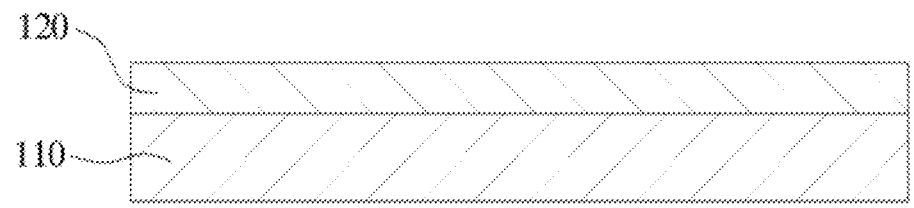
FIGS. 2A through 2E are diagrams illustrating a method of manufacturing a solar cell according to an exemplary embodiment of the present invention.

Referring to FIGS. 1 and 2A, initially, the transparent conductive layer 120 may be formed on the substrate 110 to manufacture the solar cell according to the exemplary embodiment of the present invention.

The substrate 110 may be a typical semiconductor substrate or crystal substrate. In an example, the transparent substrate 110 may be an inexpensive and easily handleable substrate that withstands a process temperature for forming the microstructures 130. For example, the transparent substrate 110 may be a silicon substrate, a silicon oxide substrate, an aluminum oxide substrate, or a strontium titanium oxide substrate.

The transparent conductive layer 120 may be formed by depositing a transparent conductive metal oxide. In an example, the metal oxide forming the transparent conductive layer 120 may be at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, (La$_{0.5}$Sr$_{0.5}$)CoO$_3$ (LSCO), La$_{0.7}$Sr$_{0.3}$MnO$_3$ (LSMO), and SrRuO$_3$ (SRO). The doped indium oxide may be at least one selected from the group consisting of ITO, IGZO, IGO, and IZO, and the doped tin oxide may be FTO (F:SnO$_2$). The doped zinc oxide may be at least one selected from the group consisting of GZO and AZO. The doped strontium titanate may be Nb:SrTiO$_2$, and the doped titanium oxide may be Nb:TiO$_2$.

Figure 2B:
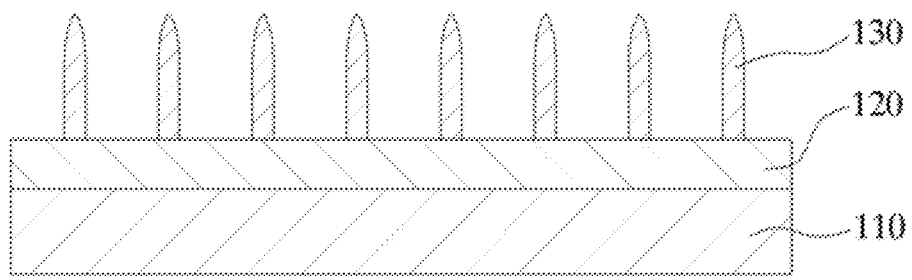

Thereafter, referring to FIGS. 1 and 2B, microstructures 130 may be formed of a metal oxide or a semiconductor material on the transparent conductive layer 120. In the present specification, a 'microstructure' refers to a nanoscale structure or microscale structure grown vertically or aslant on the transparent conductive layer 120. In an example, the microstructures 130 may include conductive metal oxide nano-linear structures formed on the transparent conductive layer 120. In this case, the nano-linear structures may include nanorods, nanowires, and nanoneedles.

The microstructures 130 may be formed of the same material as the transparent conductive layer 120. For instance, the microstructures 130 may be formed of at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, (La$_{0.5}$Sr$_{0.5}$)CoO$_3$ (LSCO), La$_{0.7}$Sr$_{0.3}$MnO$_3$ (LSMO), and SrRuO$_3$ (SRO). The doped indium oxide may be at least one selected from the group consisting of ITO, IGZO, IGO, and IZO, and the doped tin oxide may be FTO (F:SnO$_2$). The doped zinc oxide may be at least one selected from the group consisting of GZO and AZO. The doped strontium titanate may be Nb:SrTiO$_2$, and the doped titanium oxide may be Nb:TiO$_2$.

The microstructures 130 may be formed using a liquid process or a vapor deposition process, such as a vapor liquid solid (VLS) process, a chemical vapor deposition (CVD) process, a metal organic CVD (MOCVD) process, a pulsed laser deposition (PLD) process, a sol-gel process, a hydrothermal synthesis process, a wet chemical process, and a paste thick process.

In an exemplary embodiment of the present invention, the microstructures 130 may be formed using a VLS process. For example, the transparent conductive layer 120 may be formed by depositing any one of SnO$_2$, CdO, ZnO, ITO, FTO, AZO, IZO, GZO, Nb:SrTiO$_2$, Nb:TiO$_2$, LSCO, LSMO, and SRO on the substrate 110. Metal oxide nano-linear structures 130 may be formed on the transparent conductive layer 120. The metal oxide nano-linear structures 130 may be formed of the same material as the transparent conductive layer 120 using a VLS process.

Specifically, to form the metal oxide nano-linear structures 130 on the transparent conductive layer 120, a seed layer may be initially formed on the transparent conductive layer 120. The formation of the seed layer may include uniformly coating nanoparticles of a noble metal, which is stable at a high temperature and has a relatively low melting point, on the transparent conductive layer 120. The noble metal may be gold (Au), platinum (Pt), or silver (Ag). In an example, the seed layer may be formed to a thickness of about 10 nm to about 50 nm using a sputtering process. Thereafter, the same metal oxide as a material forming the transparent conductive layer 120, or a precursor thereof may be vaporized at a high temperature and then provided to a liquid-state seed layer to grow the metal oxide nano-linear structures. When vapors of the metal oxide or the precursor thereof dissolve into droplets of a noble solution, the noble solution may become a supersaturated solution to grow the metal oxide nano-linear structures.

Figure 2C:
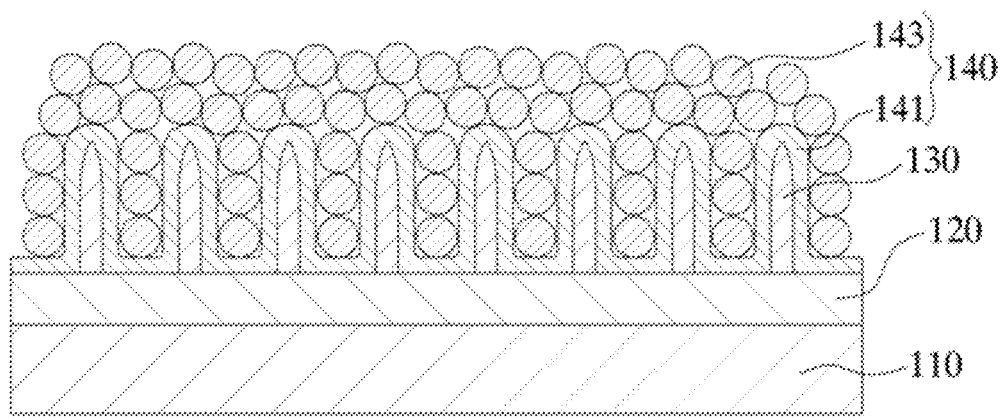

Referring to FIGS. 1 and 2C, after the microstructures 130 are formed, an electron transport layer 140 may be formed to contact the microstructures 130. The electron transport layer 140 may be formed of a metal oxide by which electrons may be transported. The electron transport metal oxide may be TiO$_2$, ZnO, SnO$_2$, WO$_3$, Fe$_2$O$_3$, Zn$_2$SnO$_3$, BaTiO$_3$, or BaSnO$_3$.

In an exemplary embodiment, the formation of the electron transport layer 140 may include sequentially forming an electron transport thin film 141 and a porous electron transport nanoparticle layer 143. The electron transport thin film 141 may be formed of an electron transport metal oxide and have a relatively low porosity. The electron transport nanoparticle layer 143 may be formed of nanoparticles of the same material as the electron transport thin film 141 and have a relatively high porosity.

The electron transport thin film 141 may be formed to coat surfaces of the microstructures 130 and the transparent conductive layer 120. The electron transport thin film 141 may prevent the electron transport thin film 141 from being in direct contact with the hole transport layer 160 to be formed later. The electron transport thin film 141 may be formed using at least one method selected from the group consisting of a CVD process, an atomic layer deposition (ALD) process, a layer-by-layer (LBL) deposition process, and a spin coating process. The electron transport thin film 141 may be formed to a thickness of about 1 nm to about 200 nm. When the electron transport thin film 141 has a thickness of about 1 nm or less, electrons and holes generated during the driving of a solar cell may recombine very rapidly at interfaces between the microstructures 130. Also, when the electron transport thin film 141 has a thickness of about 200 nm or more, generated electrons may not be easily collected by the microstructures 130 and the electrons may rapidly recombine with holes. In an exemplary embodiment, the electron transport thin film 141 may be formed to a thickness of about 10 nm to about 50 nm to facilitate separation of the electrons from the holes.

The electron transport nano-particle layer 143 may be formed on the electron transport thin film 141 using the same material as a material forming the electron transport thin film 141, namely, electron transport metal oxide nanoparticles. For example, the formation of the electron transport nanoparticle layer 143 may include coating precursor nanoparticles and annealing the precursor nanoparticles. The electron transport metal oxide nanoparticles may be disposed in spaces between the microstructures 130 coated with the electron transport thin film 141 and on the microstructures 130 coated with the electron transport thin film 141. When the electron transport metal oxide nanoparticles are disposed, the thickness of the light absorption layer may increase to increase an electron diffusion length in the light absorption layer. As a result, high charge collection efficiency may be obtained. The electron transport nanoparticle layer 143 may be a porous layer to increase a contact area between the electron transport nanoparticle layer 143 and a light absorber 150 to be combined later. The electron transport nanoparticle layer 143 may be formed using a screen printing process, a spin coating process, or a doctor blade process.

Figure 2D:
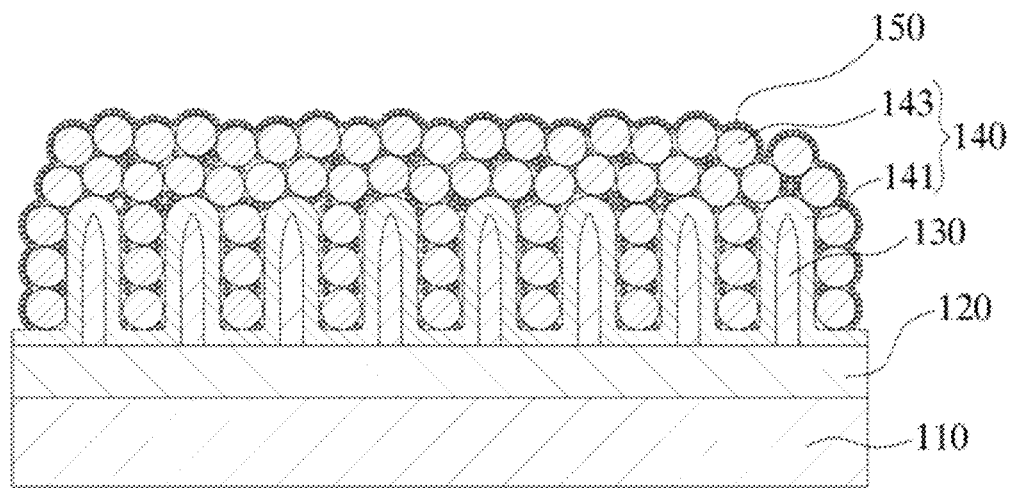

Referring to FIGS. 1 and 2D, after forming the electron transport layer 140, the light absorber 150 may be combined with a surface of the electron transport layer 140 and inner pores of the electron transport layer 140. For example, the light absorber 150 may be combined with surfaces of electron transport metal oxide nanoparticles. In the present invention, as described above, since the electron transport metal oxide nanoparticles are also disposed in spaces between the microstructures 130, the thickness of the light absorption layer may markedly increase. The light absorber 150 may be in contact with the surfaces of the electron transport metal oxide nanoparticles forming the electron transport layer 140 and form interfacial surfaces. The light absorber 150 may be an organic dye or an inorganic dye. The organic dye may be a ruthenium-based organic dye, such as N719 or N3. Also, the inorganic dye may include at least one selected from the group consisting of CdS, CdSe, CdTe, PbS, PbSe, PbTe, InP, InGaP, InAs, InCuS$_2$, MCUSe$_2$, CuFeS$_2$, InN, In$_2$S$_3$, InSb, PbS, PbSe, Bi$_2$S$_3$, Bi$_2$Se$_3$, Sb$_2$S$_3$, Sb$_2$Se$_3$, SnTe, SnS$_x$, NiS, CoS, FeS, In$_2$S$_3$, ZnSe, ZnTe, MoS, MoSe, Cu$_2$S, Ge, Si, CsPbI$_3$, CsPbBr$_3$, CsSnI$_3$, CsSnBr$_3$, CH$_3$NH$_3$PbBr$_3$, CH$_3$NH$_3$SnBr$_3$, CH$_3$NH$_3$PbI$_3$, CH$_3$NH$_3$SnI$_3$, and alloys thereof.

Figure 2E:
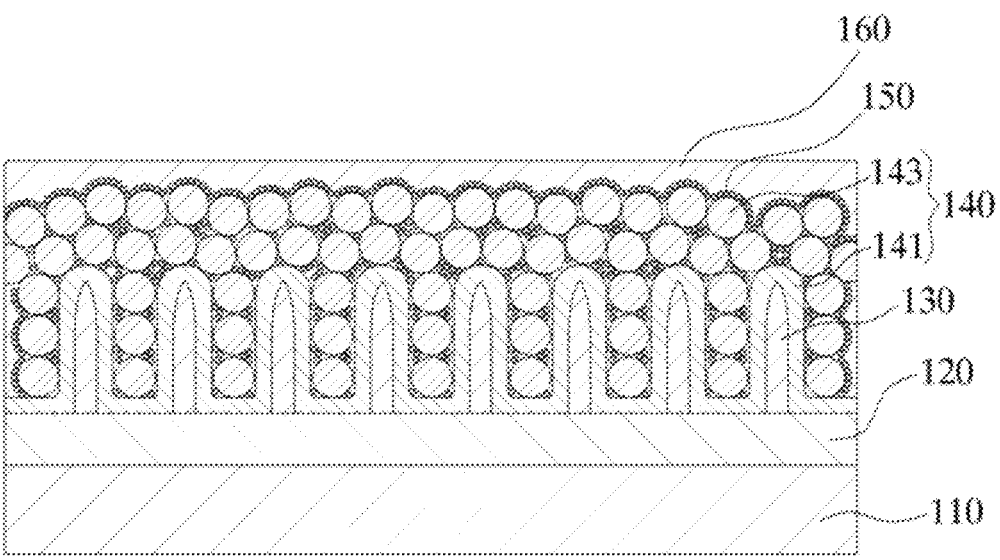

Thereafter, referring to FIGS. 1 and 2E, the hole transport layer 160 may be formed on the electron transport layer 140 combined with the light absorber 150. The hole transport layer 160 may be formed to fill the pores of the electron transport layer 140 and cover the surface of the electron transport layer 140. The hole transport layer 160 may be formed of an organic photovoltaic material. The organic photovoltaic material may be a conjugated polymer material in which an energy difference between an HOMO level and an LUMO level is within about 3.5 eV. For example, the organic photovoltaic material may be at least one selected from the group consisting of Spiro-OMeTAD, P3HT, P3AT, P3OT, and PEDOT:PSS.

Thereafter, referring to FIG. 1, an electrode layer 170 may be formed on the hole transport layer 160. The electrode layer 170 may be formed by depositing at least one material selected from the group consisting of gold (Au), silver (Ag), platinum (Pt), palladium (Pd), copper (Cu), aluminum (Al), vanadium (V), molybdenum (Mo), and compounds thereof on the hole transport layer 160.

Example

An ITO transparent conductive layer was formed on one surface of a glass substrate with a size of 10 mm×20 mm.

Thereafter, gold (Au) was deposited on the transparent conductive layer using a sputtering process to form a seed layer to a thickness of about 10 nm to about 50 nm. Afterwards, ITO nano-linear structures were grown in a high-temperature electric tube furnace using a VLS process. In this case, a precursor material for synthesizing ITO nano-linear structures was put into a boat crucible and positioned in the center of the electric tube furnace, and a substrate having the seed layer was disposed a predetermined distance from the center of the electric tube furnace. A carrier gas was injected from one end of a tube, and a flow rate of the carrier gas was controlled using a liquid flow meter in the range of about 10 sccm to about 500 sccm. A temperature of the electric tube furnace was controlled in the range of about 500° C. to about 900° C. in consideration of a vapor pressure of a nanoline precursor and a decomposition temperature of the precursor material.

To prevent direct adhesion of the grown ITO nano-linear structures to a hole transport layer, a $TiO_2$ thin film was formed using an ALD process to a thickness of about 10 nm, and annealed for about 1 hour at a temperature of about 450° C. A $TiO_2$ nanoparticle precursor was coated on the $TiO_2$ thin film using a screen printing process, and annealed at a temperature of about 450° C. Thereafter, the annealed substrate was dipped in a 0.05 M titanium tetrachloride ($TiCl_4$) diluted solution for about 2 hours. In this case, the diluted solution was maintained at a temperature of about 30° C. Thereafter, the substrate was annealed again at a temperature of about 450° C. for about 1 hour to form a porous electron transport layer.

Thereafter, a Z907 ruthenium-based organic dye was dissolved at a concentration of about 3 mM in a solution prepared by mixing tert-butanol and acetonitrile in a weight fraction (wt %) ratio of about 1:1, a photoelectrode was dipped therein, and the dye was adsorbed at room temperature for about 1 to 24 hours. Thereafter, a dye layer physically adsorbed to acetonitrile was removed, and the resultant structure was dried.

Thereafter, a hole transfer was spin-coated at about 200 rpm for about 45 seconds. Thus, due to spiro-OMeTAD serving as a hole conductive material, a hole transport layer 160 was formed to fill inner pores of the porous electron transfer layer and cover the entire top of the electron transfer layer. The hole transfer was prepared by adding a 0.16 mL solution prepared by dissolving bis(trifluormethane) sulfonimide lithium salt in acetonitrile at a concentration of about 170 mg/mL to a solution prepared by dissolving spiro-OMeTAD serving as the hole conductive material in chlorobenzene at a concentration of about 180 mg/mL at a temperature of about 70° C. to about 100° C. for about 30 minutes to 1 hour and adding 0.08 mL tertbutyl pyridine.

Thereafter, gold (Au) was deposited on the hole transfer layer using a high-vacuum thermal evaporator to a thickness of about 200 nm to form an electrode layer.

Comparative Example

Fluorine-doped tin oxide (F-doped $SnO_2$ (FTO)) was coated on one surface of a glass substrate with a size of 10 mm×20 mm to form a transparent conductive layer.

Thereafter, a $TiO_2$ nanoparticle precursor was coated on the transparent conductive layer using a doctor blade process, and annealed at a temperature of about 450° C. The annealed substrate was dipped in a 0.05 M $TiCl_4$ diluted solution for about 2 hours. In this case, the diluted solution was maintained at a temperature of about 30° C. Thereafter, the substrate was annealed again at a temperature of about 450° C. for about 1 hour to form a porous electron transport layer.

Thereafter, a light absorber 150, a hole transport layer 160, and an electrode were formed using the same materials under the same process conditions as in the example.

Experimental Example

Estimation of Properties

Figure 3:
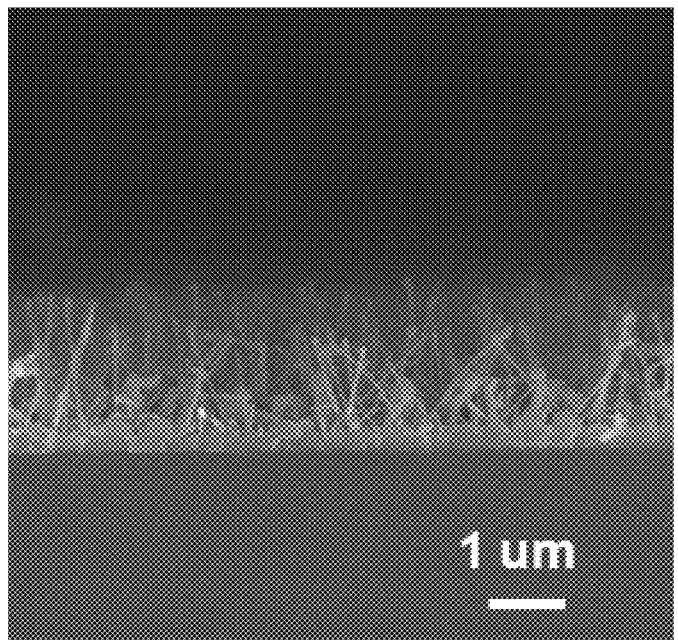
FIG. 3 is a scanning electron microscope (SEM) image of indium tin oxide (ITO) nano-linear structures grown on an ITO thin film according to an example.
Figure 4:
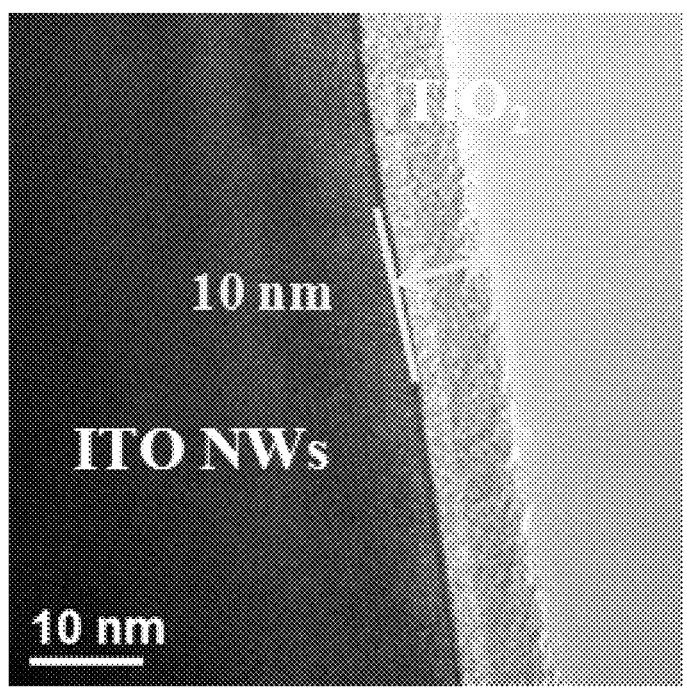
FIG. 4 is a SEM image of a titanium oxide (TiO$_2$) thin film formed by depositing TiO$_2$ on ITO nano-linear structures to a thickness of about 10 nm according to the example.
Figure 5:
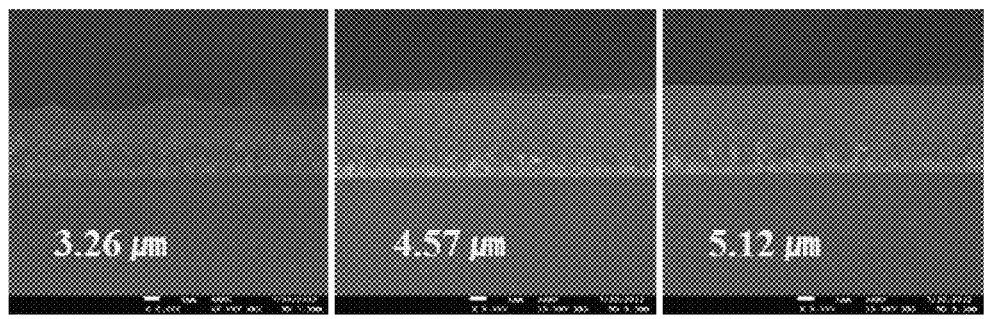
FIG. 5 shows SEM images of a porous electron transfer layer formed by coating a TiO$_2$ nanoparticle precursor on a TiO$_2$ thin film using a screen printing process.

FIG. 3 is a scanning electron microscope (SEM) image of ITO nano-linear structures grown on an ITO thin film according to the example. FIG. 4 is an SEM image of a titanium oxide ($TiO_2$) thin film formed by depositing $TiO_2$ on ITO nano-linear structures to a thickness of about 10 nm according to the example. FIG. 5 shows SEM images of a porous electron transfer layer formed by coating a $TiO_2$ nanoparticle precursor on a $TiO_2$ thin film using a screen printing process.

Referring to FIG. 3, it can be seen that nano-linear structures serving as microstructures may be formed on a transparent conductive layer according to a method described in the example. Also, according to the present experiment, it can be seen that the length of ITO nano-linear structures may be adjusted by controlling a process temperature and a process time.

Referring to FIGS. 4 and 5, according to the method described in the example, it can be seen that an electron transfer thin film may be formed to coat surfaces of nano-linear structures, and an electron transfer nanoparticle layer may be stably formed on the electron transfer thin film.

Figure 6:
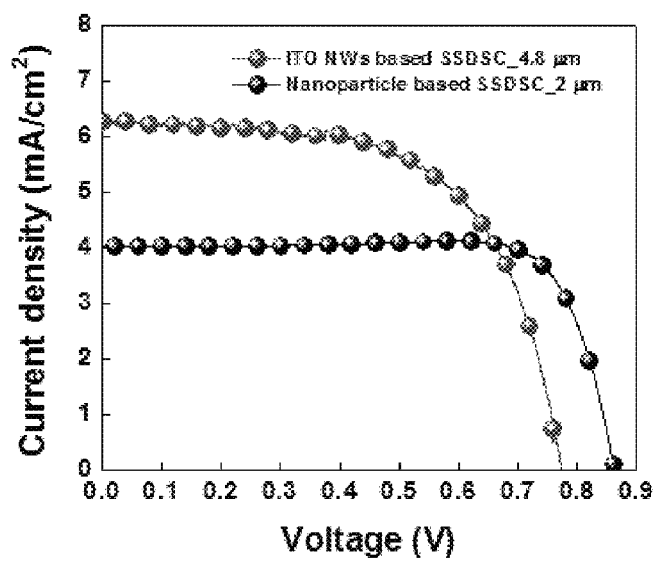
FIG. 6 is a graph of current relative to voltage in a solar cell manufactured according to the example and a solar cell manufactured according to a comparative example.

FIG. 6 is a graph of current relative to voltage in a solar cell manufactured according to the example and a solar cell manufactured according to the comparative example. Table 1 shows measurements of 'Jsc,' 'Voc,' 'Fill factor (FF)' and efficiency of the solar cell manufactured according to the example and the solar cell manufactured according to the comparative example.

TABLE 1

|  | Thickness (μm) | Jsc (mA/cm$^2$) | Voc (V) | FF (%) | Efficiency (%) |
|---|---|---|---|---|---|
| Comparative example | 2 | 4.04 | 0.863 | 80.11 | 2.79 |
| Example | 4.8 | 6.29 | 0.774 | 61.30 | 2.98 |

Referring to FIG. 6 and Table 1, in the solar cell manufactured according to the example, the electron transfer layer had a thickness of about 4.8 μm and a current density of about 6.29 mA/cm$^2$. In the solar cell manufactured according to the comparative example, an electron transfer layer had a thickness of about 2 µm and a current density of about 4.04 mA/cm². That is, it can be seen that although a light absorption layer of the solar cell manufactured according to the example was at least twice as thick as a light absorption layer of the solar cell manufactured according to the comparative example, the light absorption layer of the solar cell manufactured according to the example did not have a lower current density but had about 1.5 times the photocurrent density of the light absorption layer of the solar cell manufactured according to the comparative example.

Figure 7:
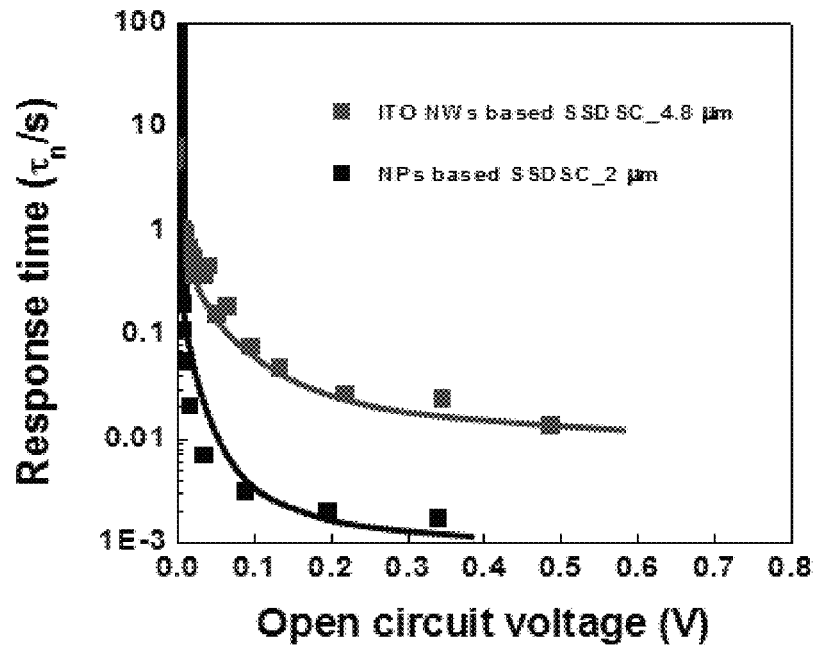
FIG. 7 is a graph showing measurements of 'transient Voc' indicating a Voc reduction under an open voltage condition in a solar cell manufactured according to the example and a solar cell manufactured according to the comparative example.

FIG. 7 is a graph showing measurements of 'transient Voc' indicating a Voc reduction under an open voltage condition in a solar cell manufactured according to the example and a solar cell manufactured according to the comparative example.

Referring to FIG. 7, it can be seen that an electron annihilation time of the solar cell manufactured according to the example was about 10 times longer than an electron annihilation time of the solar cell manufactured according to the comparative example. That is, it can be ascertained that the solar cell manufactured according to the example had higher charge collection efficiency than the solar cell manufactured according to the comparative example.

Figure 8:
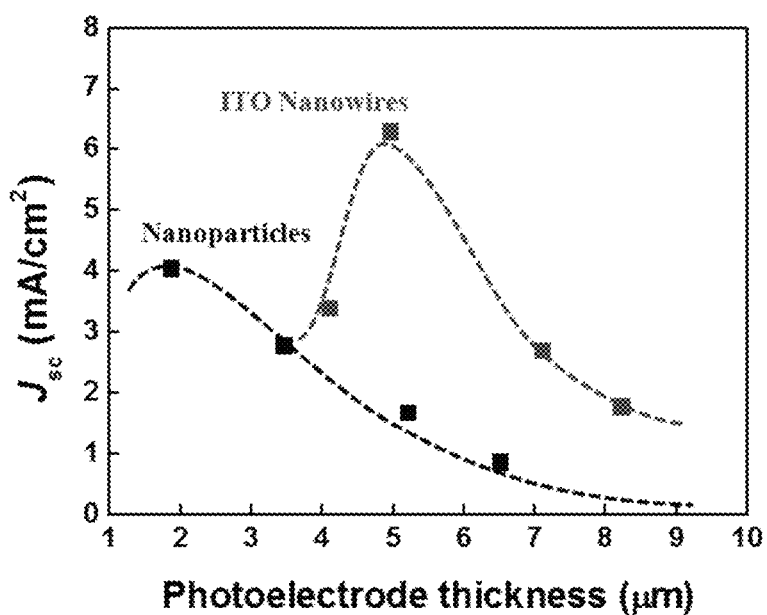
FIG. 8 is a graph showing measurements of a photocurrent density relative to the thickness of a light absorption layer in a solar cell manufactured according to the example and a solar cell manufactured according to the comparative example.

FIG. 8 is a graph showing measurements of a photocurrent density relative to the thickness of a light absorption layer in a solar cell manufactured according to the example and a solar cell manufactured according to the comparative example.

Referring to FIG. 8, the solar cell manufactured according to the example generated the highest current density when the light absorption layer had a thickness of about 4.8 µm, while the solar cell manufactured according to the comparative example had the highest current density when the light absorption layer had a thickness of about 2 µm.

According to the present invention, the thickness of a light absorption layer can be maximized based on excellent physical properties of a conductive metal oxide, thereby enabling manufacture of a solar cell having a high current density and high photoelectric conversion efficiency.

A nanoscale structure or microscale structure formed of a conductive metal oxide can reduce a speed of recombination between a hole transfer organic material and semiconductor nanoparticles and elevate charge collection efficiency, as compared with a conventional nanoparticle-based all-solid-phase thin-film solar cell. As a result, an electron diffusion length in a light absorption layer can increase, and the thickness of the light absorption layer can markedly increase.

According to the present invention, a thickness of the light absorption layer of a currently required all-solid-phase thin film solar cell can be increased. Thus, a nanoscale structure or microscale structure including a conductive metal oxide can be used not only for the all-solid-phase thin film solar cell but also in various fields to which photovoltaic devices can be applied.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A solar cell comprising:
   a substrate;
   a transparent conductive layer disposed on the substrate;
   microstructures extending substantially perpendicular to a surface of the transparent conductive layer;
   an electron transport layer comprising an electron transport metal oxide disposed to fill at least part of space between the microstructures and cover the microstructures;
   a light absorber adhered to inner pores and a surface of the electron transport layer;
   a solid hole transport layer disposed to fill inner pores of the electron transport layer and cover the surface of the electron transport layer to which the light absorber is attached; and
   an electrode disposed on the hole transport layer,
   wherein the electron transport layer comprises:
   an electron transport thin film configured to coat the microstructures and the surface of the transparent conductive layer; and
   an electron transport nanoparticle layer disposed on the electron transport thin film and having a porosity high than that of the electron transport thin film.

2. The solar cell of claim 1, wherein the microstructures comprise nano-linear structures.

3. The solar cell of claim 2, wherein the nano-linear structures comprise at least one selected from the group consisting of nanorods, nanowires, and nanoneedles.

4. The solar cell of claim 2, wherein the transparent conductive layer and the microstructures comprise at least one material selected from the group consisting of doped or undoped indium oxide, doped or undoped tin oxide, doped or undoped zinc oxide, doped or undoped titanium oxide, doped or undoped tungsten oxide, doped or undoped cadmium oxide, doped or undoped antimony oxide, doped or undoped niobium oxide, doped or undoped barium titanate, doped or undoped strontium titanate, cadmium sulfide, $(La_{0.5}Sr_{0.5})CoO_3$ (LSCO), $La_{0.7}Sr_{0.3}MnO_3$ (LSMO), and $SrRuO_3$ (SRO).

5. The solar cell of claim 4, wherein the doped indium oxide comprises at least one selected from the group consisting of tin (Sn)-doped indium oxide (indium tin oxide; no), indium gallium zinc oxide (IGZO), indium gallium oxide (IGO), and indium zinc oxide (IZO),
   the doped tin oxide comprises fluorine (F)-doped tin oxide (FTO; $F:SnO_2$),
   the doped zinc oxide comprises at least one selected from the group consisting of Ga-doped zinc oxide (GZO) and aluminum (Al)-doped zinc oxide (AZO),
   the doped strontium titanate comprises $Nb:SrTiO_2$, and
   the doped titanium oxide comprises $Nb:TiO_2$.

6. The solar cell of claim 1, wherein the electron transport layer comprises at least one material selected from the group consisting of $TiO_2$, $ZnO$, $SnO_2$, $WO_3$, $Fe_2O_3$, $Zn_2SnO_3$, $BaTiO_3$, and $BaSnO_3$.

7. The solar cell of claim 1, wherein the electron transport thin film is configured to prevent the microstructures from being in direct contact with the hole transport layer.

8. The solar cell of claim 1, wherein the electron transport layer has a thickness of about 1 nm to about 200 nm.

9. The solar cell of claim 1, wherein the electron transport nanoparticle layer comprises electron transport metal oxide nanoparticles coated on the electron transport thin film.

10. The solar cell of claim 1, wherein the light absorber comprises an organic dye or inorganic dye adhered to inner pores and a surface of the electron transport nanoparticle layer.

11. The solar cell of claim 10, wherein the organic dye comprises a ruthenium (Ru)-based organic dye, and the inorganic dye includes at least one selected from the group consisting of CdS, CdSe, CdTe, PbS, PbSe, PbTe, InP, InGaP, InAs, $InCuS_2$, $InCuSe_2$, $CuFeS_2$, InN, $In_2S_3$, InSb, PbS, PbSe, $Bi_2S_3$, $Bi_2Se_3$, $Sb_2S_3$, $Sb_2Se_3$, SnTe, $SnS_x$, NiS, CoS, FeS, $In_2S_3$, ZnSe, ZnTe, MoS, MoSe, $Cu_2S$, Ge, Si, $CsPbI_3$, $CsPbBr_3$, $CsSnI_3$, $CsSnBr_3$, $CH_3NH_3PbBr_3$, $CH_3NH_3SnBr_3$, $CH_3NH_3PbI_3$, $CH_3NH_3SnI_3$, and alloys thereof.

12. The solar cell of claim 1, wherein the hole transport layer is disposed to fill inner pores of the electron transport nanoparticle layer and cover a surface of the electron transport nanoparticle layer.

13. The solar cell of claim 12, wherein the hole transport layer comprises an organic photovoltaic material.

14. The solar cell of claim 13, wherein the organic photovoltaic material comprises at least one selected from the group consisting of Spiro-OMeTAD, P3HT, P3AT, P3OT, and PEDOT:PSS.

\* \* \* \* \*